(12) United States Patent
Futatsuyama

(10) Patent No.: US 8,023,327 B2
(45) Date of Patent: Sep. 20, 2011

(54) NON-VOLATILE SEMICONDUCTOR MEMORY DEVICE

(75) Inventor: Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 12/499,237

(22) Filed: Jul. 8, 2009

(65) Prior Publication Data

US 2010/0067299 A1 Mar. 18, 2010

(30) Foreign Application Priority Data

Sep. 12, 2008 (JP) ................... 2008-234255

(51) Int. Cl.
*G11C 16/04* (2006.01)
*G11C 16/06* (2006.01)

(52) U.S. Cl. ........... 365/185.17; 365/185.2; 365/185.22; 365/185.29

(58) Field of Classification Search ............. 365/185.17, 365/185.2, 185.22, 185.29
See application file for complete search history.

(56) References Cited

U.S. PATENT DOCUMENTS

| | | | |
|---|---|---|---|
| 6,816,411 B2 | 11/2004 | Arai et al. | |
| 7,180,787 B2 | 2/2007 | Hosono et al. | |
| 7,408,807 B2 | 8/2008 | Roohparvar | |
| 7,558,118 B2 | 7/2009 | Futatsuyama | |
| 7,675,772 B2 * | 3/2010 | Goda et al. ............... | 365/185.03 |
| 2008/0205139 A1 | 8/2008 | Futatsuyama | |
| 2008/0239812 A1 * | 10/2008 | Abiko et al. ............. | 365/185.12 |
| 2009/0109759 A1 * | 4/2009 | Aritome .................... | 365/185.19 |
| 2009/0238003 A1 | 9/2009 | Namiki et al. | |
| 2009/0251971 A1 | 10/2009 | Futatsuyama | |

FOREIGN PATENT DOCUMENTS

| | | |
|---|---|---|
| JP | 11-250681 | 9/1999 |
| JP | 2003-178590 | 6/2003 |
| JP | 2005-116102 | 4/2005 |
| JP | 2005-285185 | 10/2005 |
| JP | 2005-327409 | 11/2005 |
| JP | 2007-80477 | 3/2007 |

OTHER PUBLICATIONS

U.S. Appl. No. 12/883,520, filed Sep. 16, 2010, Namiki, et al.
Office Action issued Oct. 26, 2010 in JP Application No. 2008-234255 (With English Translation).

* cited by examiner

*Primary Examiner* — Tuan Nguyen
*Assistant Examiner* — Toan Le
(74) *Attorney, Agent, or Firm* — Oblon, Spivak, McClelland, Maier & Neustadt, L.L.P.

(57) ABSTRACT

A memory device including a NAND string with multiple memory cells connected in series, one end of the NAND string being coupled to a bit line via a first select gate transistor while the other end is coupled to a source line via a second select gate transistor, wherein the device has a data read mode performed under the bias condition of: a selected cell is applied with a read voltage; and unselected cells are applied with read pass voltages, and wherein in the data read mode, one of the unselected cells adjacent to one of the first and second select gate transistor is applied with a first read pass voltage while the other unselected cells are applied with a second read pass voltage lower than the first read pass voltage.

14 Claims, 13 Drawing Sheets

Erase-verify

NON-VOLATILE SEMICONDUCTOR MEMORY DEVICE

CROSS-REFERENCE TO RELATED APPLICATION

This application is based on and claims the benefit of priority from the prior Japanese Patent Application No. 2008-234255, filed on Sep. 12, 2008, the entire contents of which are incorporated herein by reference.

BACKGROUND OF THE INVENTION

1. Field of the Invention

This invention relates to an electrically rewritable and non-volatile semiconductor memory device (EEPROM), specifically to a NAND-type flash memory.

2. Description of the Related Art

A NAND-type flash memory is known as one of electrically rewritable and highly-integrated non-volatile semiconductor memory devices. In the NAND-type flash memory, multiple memory cells are connected in series in such a manner that adjacent two cells share a source/drain diffusion layer, thereby constituting a NAND cell unit (i.e., NAND string). The respective ends of the NAND string are coupled to a bit line and a source line via select gate transistors. By use of such a NAND-sting structure, a large capacity of memory device may be achieved with a small unit cell area in comparison with a NOR-type flash memory.

A memory cell in the NAND-type flash memory has a charge storage layer (e.g., floating gate) formed on a semiconductor substrate with a tunnel insulating film interposed therebetween, and a control gate stacked on the floating gate with an inter-gate insulating film interposed therebetween, and stores data in a non-volatile manner in accordance with a charge storage state in the floating gate. Explaining in detail, binary data storage may be defined as follows: a high threshold state obtained by injecting electrons into the floating gate is defined as, for example, data "0" while a low threshold state obtained by discharging the electrons in the floating gate as data "1". Recently, such a multi-level data storage scheme (for example, a four-level data storage scheme) is made to be usable that the write threshold distribution is divided into multiple levels.

Data program or write of the NAND-type flash memory is performed by a page. One page is defined as a set of memory cells arranged along a selected word line or the half. Explaining in detail, data write is performed by applying program or write voltage Vpgm to a selected word line, thereby injecting electrons into the floating gate from the cell channel with FN tunneling current. In this data write mode, channel potentials of the respective NAND cells are controlled via the corresponding bit lines in accordance with write data "0" and "1".

In detail, in case of "0" writing, the corresponding bit line is set at Vss, and this bit line potential will be transferred to the selected cell's channel via a select gate transistor. In this case, when a selected word line is applied with write voltage Vpgm, large electric field is applied between the floating gate and the cell channel in the selected cell, so that electrons are injected into the floating gate. By contrast, in case of "1" writing (i.e., write-inhibiting), the corresponding bit line is set at Vdd. As a result, the selected cell's channel is charged up to Vdd-Vth (Vth is threshold voltage of the select gate transistor) via the select gate transistor to be set in a floating state. In this case, when the selected word line is applied with write voltage Vpgm, the selected cell's channel is boosted in potential by capacitive coupling from the selected word line, so that electron injection into the floating gate will be inhibited.

Prior to data writing, data erasing is performed for resetting the cells in a block to be in a negative threshold state. Explaining in detail, data erase is performed by: applying 0V to all word lines in the block and applying erase voltage Vera to the cell p-type well, thereby discharging electrons in the floating gates of all cells in the block to the cell p-type well.

Erase-verify for verifying the erase state is performed in such a way as to detect that the threshold voltage of all cells in the NAND string have been set to be negative. The erase-verify is performed in principle by judging whether cell current flows or not in the cell channel from the corresponding bit line under the condition that all word lines are set at a certain voltage equal to the ground potential or higher than it (for example, 0V). For example, refer to JPA-2004-030897.

However, under the condition that negative voltage can not be used, the above-described method has such a limit that it is detected only whether the cell threshold is set to be under 0V or not. To detect a negative threshold voltage of an erased cell, it will be used such a method that cell current is carried in the NAND string from the source line CELSRC to the bit line BL as reverse to the normal read mode.

That is, under the condition that all word lines in the NAND string are set at 0V, cell current is carried from the cell source line CELSRC to the bit line BL. If the threshold voltage of all cells is set at about −Vth, the bit line will be charged up to Vth. Therefore, detect this bit line charged level, and the negative threshold voltage may be detected. For example, refer to JPA-2007-305204.

On the other hand, there is another method for verifying erased cell's threshold voltage with such a scheme that cell current is carried from the bit line to the cell source line as similar to the normal read operation. This is for substantially verifying the cell's negative threshold voltage under the condition that word lines are set at 0V; the source line and the cell p-type well are applied with positive voltage V0; and the bit lines and select gate lines are applied with the positive voltage V0 in addition to the normal driving voltages. For example, refer to JPA-2008-103003.

Although, some erase-verify methods have been explained above, as a problem of erase-verifying, there is a possibility that a cell underlying a word line adjacent to a select gate line is erroneously judged as erased due to a noise from the select gate line in spite of that it is not sufficiently erased. That is, when a select gate line is applied with a select voltage for coupling a NAND string to a bit line, a word line adjacent to the select gate line (i.e., adjacent word line), which is to be kept at 0V, is temporally boosted in potential due to capacitive coupling. As a result, the cell underlying the adjacent word line is turned on in spite of that it is not erased, and it leads to erroneous judgment that the erase-verify is passed.

This problem becomes larger in accordance with that the integration and capacity of the cell array are made progress. Further, in case it is in need of setting precisely narrow cell's threshold distributions for a multi-level data storage scheme, there is a probability that it becomes difficult to set the threshold distribution.

SUMMARY OF THE INVENTION

According to an aspect of the present invention, there is provided a non-volatile semiconductor memory device including a NAND string, in which multiple memory cells are connected in series, one end of the NAND string being coupled to a bit line via a first select gate transistor while the other end is coupled to a source line via a second select gate transistor, wherein the memory device has a data read mode performed under the bias condition of: a selected cell in the NAND string is applied with a read voltage; and unselected cells in the NAND string are applied with read pass voltages set to turn on cells without regard to cell data, and wherein in the data read mode, one of the unselected cells adjacent to one of the first and second select gate transistor is applied with a first read pass voltage while the other unselected cells are applied with a second read pass voltage lower than the first read pass voltage.

According to another aspect of the present invention, there is provided a non-volatile semiconductor memory device including a NAND string, in which multiple memory cells are connected in series, one end of the NAND string being coupled to a bit line via a first select gate transistor while the other end is coupled to a source line via a second select gate transistor, control gates of the memory cells being coupled to word lines respectively while gates of the first and second select gate transistors are coupled to first and second select gate lines, respectively, wherein the memory device has a data read mode performed under the bias condition of: a selected word line in the NAND string is applied with a read voltage; an unselected word line adjacent to one of the first and second select gate lines is applied with a first read pass voltage; and the other unselected word lines are applied with a second read pass voltage lower than the first read pass voltage.

According to still another aspect of the present invention, there is provided a non-volatile semiconductor memory device including a NAND string, in which multiple memory cells are connected in series, one end of the NAND string being coupled to a bit line via a first select gate transistor while the other end is coupled to a source line via a second select gate transistor, a dummy cell being inserted in the NAND string to be disposed adjacent to at least one of the first and second select gate transistor, control gates of the memory cells and the first and second dummy cells being coupled to word lines and the first and second dummy word lines respectively while gates of the first and second select gate transistors are coupled to first and second select gate lines, respectively, wherein the memory device has a data read mode performed under the bias condition of: a selected word line in the NAND string is applied with a read voltage; the dummy word line is applied with a first read pass voltage; and unselected word lines are applied with a second read pass voltage lower than the first read pass voltage.

DETAILED DESCRIPTION OF THE EMBODIMENTS

Illustrative embodiments of this invention will be explained with reference to the accompanying drawings below.

Figure 1:
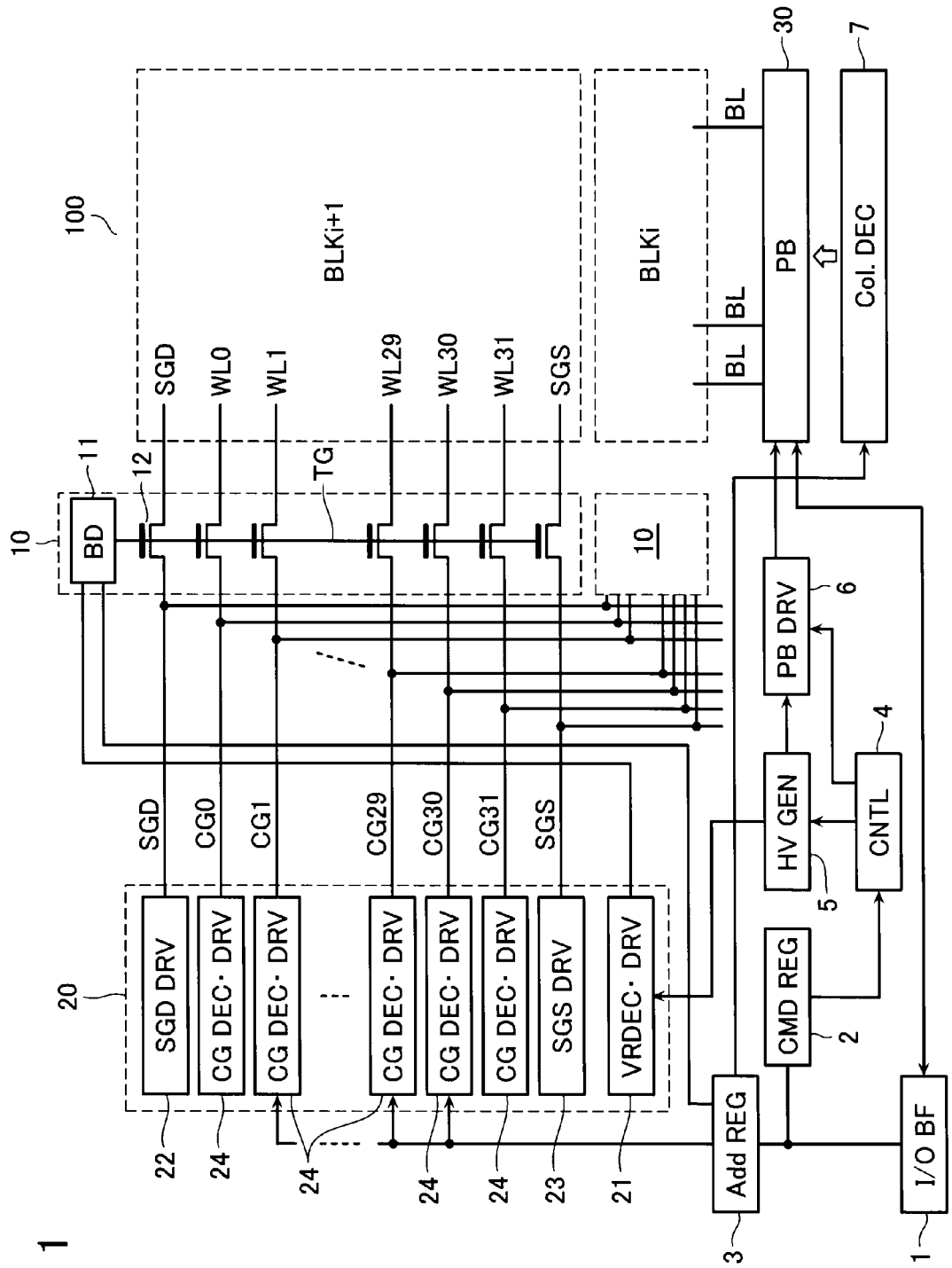
FIG. 1 shows the whole configuration of a NAND-type of flash memory in accordance with an embodiment of the present invention.
Figure 2:
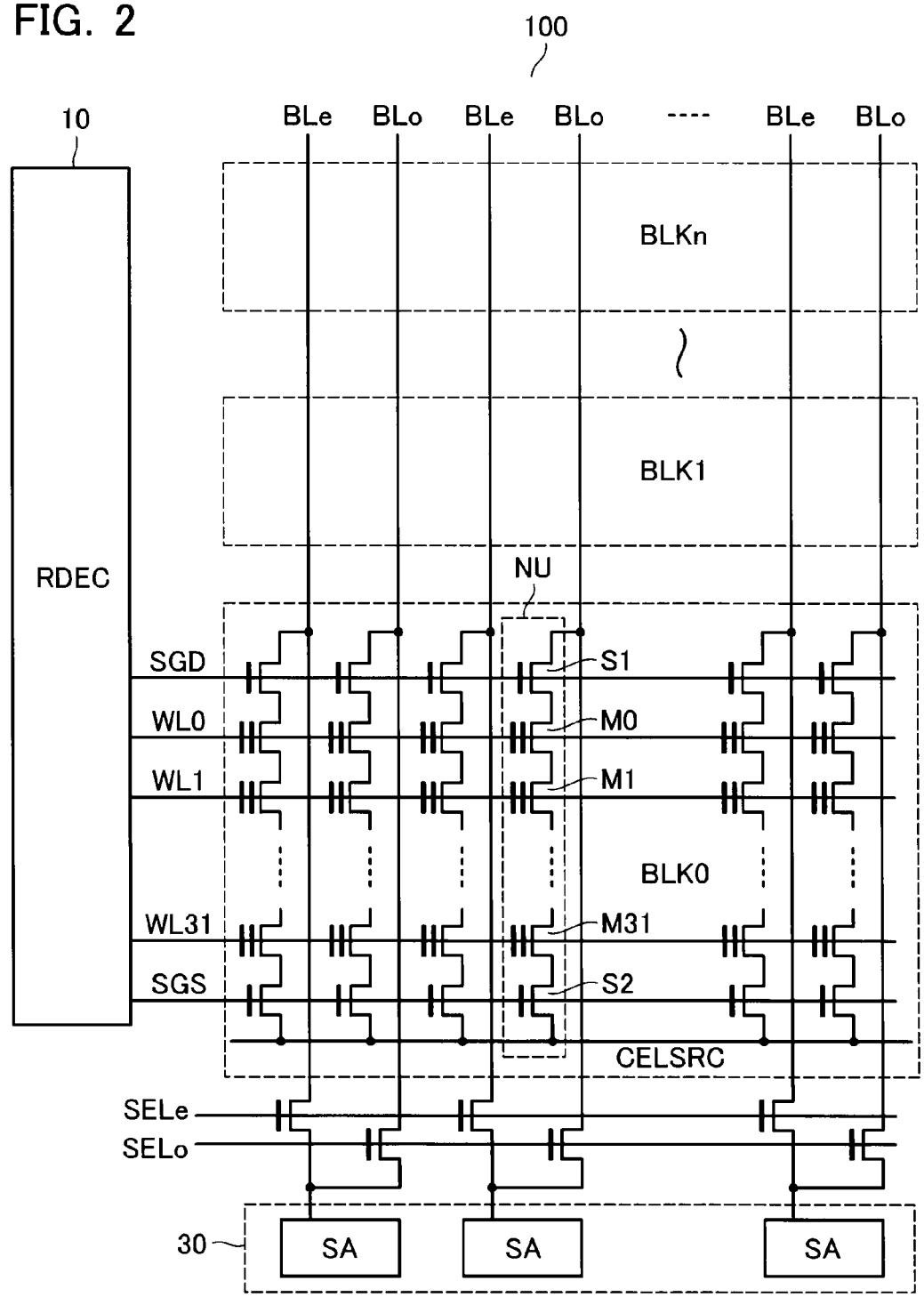
FIG. 2 shows the memory core of the NAND-type flash memory.

FIG. 1 shows the whole configuration of a NAND-type flash memory in accordance with an embodiment, and FIG. 2 shows the equivalent circuit of the memory cell array 100. A NAND cell unit (i.e., NAND string) NU serving as a unit of this NAND-type flash memory has a basic configuration described as follows: multiple memory cells M0-M31 are connected in series; and two select gate transistors S1 and S2 are disposed at both ends thereof.

It will be explained in the embodiment described later that there are often inserted dummy cells adjacent to the select gate transistors in the NAND string. These dummy cells have the same configuration as the normal cells M0-M31 excepting that these are not accessible by normal address inputting.

One end of the NAND string NU is coupled to a bit line BL via a select gate transistor S1; and the other end to a common cell source line CELSRC in the memory cell array 100.

The cell well is a P-type well, and the memory cell array 100 is formed on the P-type well, which is formed on a silicon substrate with an N-type well interposed therebetween. One memory cell has N-type of source and drain diffusion layers; and a stacked gate structure of a floating gate serving as a charge storing layer and a control gate. Change the charge amount stored in the floating gate with write and erase operations, and the memory cell's threshold voltage is settable, which serves as one bit or multi-bit data.

Alternatively, it should be noted that another memory cell structure may be usable. That is, it will be used a memory cell, which has a charge storage layer (i.e., charge trap) formed in the gate insulating film in place of the floating gate.

Control gates of the memory cells in the NAND string NU are coupled to different word lines WL0-WL31; and gates of the select gate transistors S1 and S2 to select gate lines SGD and SGS, respectively.

A set of NAND strings sharing word lines WL0-WL31 and select gate lines SGD and SGS constitutes a block BLK, which serves as a unit to be erased in a lump. As shown in FIGS. 1 and 2, multiple blocks (BLKi, BLKi+1, . . . ) are arranged in the bit line direction.

The various operations of the NAND flash memory will be controlled in accordance with input commands. For example, in a write mode, data loading command is input to command register 2 via input/output (I/O) buffer 1; write destination address is latched in address register 3 via I/O buffer 1; write data is loaded into the sense amplifier circuit (serving as write circuit) 30; and then, write executing command is latched in the command register 2 via the I/O buffer 1. As a result, automatic and internal write operation starts.

That is, in receipt of the write executing command, sequence controller 4 starts to execute the internal sequence control. That is, in the write operation, the sequence controller 4 controls: voltages necessary for the respective write operations; timings of write pulse application and verify-read operation and the like; and write cycles repeatedly performed with write pulse applications and verify-read operations until write completion.

High voltage generation circuit 5 generates various high voltages (boosted voltages) under the control of the sequence controller 4 such as write voltage (Vpgm), write pass voltage (Vpass), read pass voltage (Vread) and others necessary for row-system signal driving circuit 20 and page buffer control circuit 6.

The row-system signal driving circuit 20 includes CG decoder drivers 24 for controlling word line voltage, the number of which is equal to that of the word lines in a NAND string, for example, SGD driver 22 for driving drain side select gate line SGD, SGS driver 23 for driving source side select gate line SGS and VDEC driver 21 for generating block decoder-use boosted power supply voltage VDEC. These drivers 21-24 are shared by multiple blocks in the memory cell array 100.

Since it is required of the respective word lines in a selected NAND string to be driven with some kinds of voltages, page address in a row address, which is used for selecting a word line in a NAND string, is input to the respective CG decoder drivers 24.

Disposed at the word line end of every block in the memory cell array 100 is a narrow-sense row decoder 10, which serves for selecting a block. Row decoder 10 has block decoder 11 for receiving block address from the address register 3 to decode it, and transfer transistor array 12, the common gate TG of which is controlled with the output of block decoder 11 for transferring voltages necessary for writing, erasing or reading to word lines and select gate lines in the selected block. Block decoder 11 includes a level shift circuit for generating a desired voltage applied to the common gate TG of the transfer transistor array 12.

One ends of transistors in the transfer transistor array 12 are coupled to the output nodes of the respective drivers 21-24; and the other ends to word lines and select gate lines in the memory cell array 100. For example, it is required of a selected word line to be applied with write voltage Vpgm (about 20V) in a write pulse applying mode. At this time, the common gate TG of the transfer transistor array 12 is applied with Vpgm+Vt (Vt: threshold voltage of the transfer transistors), which is supplied from VDEC driver 21.

Column decoder 7 serves for decoding column address supplied from address register 3 in case of, for example, write data loading, and coupling the I/O butter to the selected sense units SA, so that write data of the respective column addresses are loaded in the sense amplifier circuit 30. By contrast, in a read mode, page data read in the page buffer 30 in a lump is selected by a column in accordance with column addresses and output sequentially via I/O buffer 1.

FIG. 2 shows an example, in which an even numbered bit line BLe and adjacent odd numbered bit line BLo share a sense amplifier SA. In a write or read mode, even numbered bit lines BLe or odd numbered bit lines BLo are selectively coupled to the sense amplifiers SA. At this time, unselected bit lines serves as shield lines, so that the interference between bit lines may be avoided.

With this sense amplifier scheme, memory cells selected by a word line and all even numbered bit lines constitute a page (i.e., even page) serving as a unit of writing and reading in a lump while memory cells selected by a word line and all odd numbered bit lines constitute another page (i.e., odd page). It should be noted here that there is another sense scheme. In another sense scheme, the whole memory cells at the cross points of a selected word line and all bit lines constitute a physical page, which serves as a unit of reading in a lump.

Figure 3:
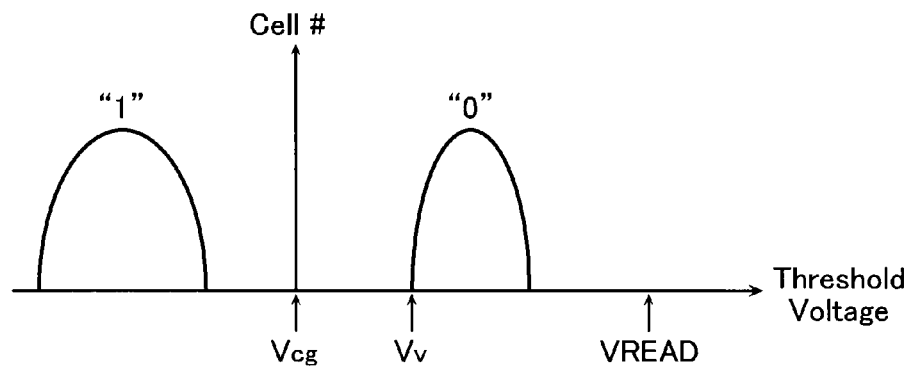
FIG. 3 shows one example of data threshold distributions of the NAND-type flash memory.

FIG. 3 shows a cell data threshold distribution in case of a binary data storage scheme. Binary data storage is defined as follows: negative threshold state (erase state) is defined as data "1"; and positive threshold state (write state) is defined as data "0". The lower limit value of data "0" threshold distribution is defined by the verify-read voltage Vv at the write-verify time.

In a read mode, it is detected whether cell current flows or not in a selected cell under the condition of: a selected word line is applied with read voltage Vcg set between data "0" and "1"; and unselected word lines with read pass voltage VREAD, which is set to turn on cells without regard to cell data.

Figure 4:
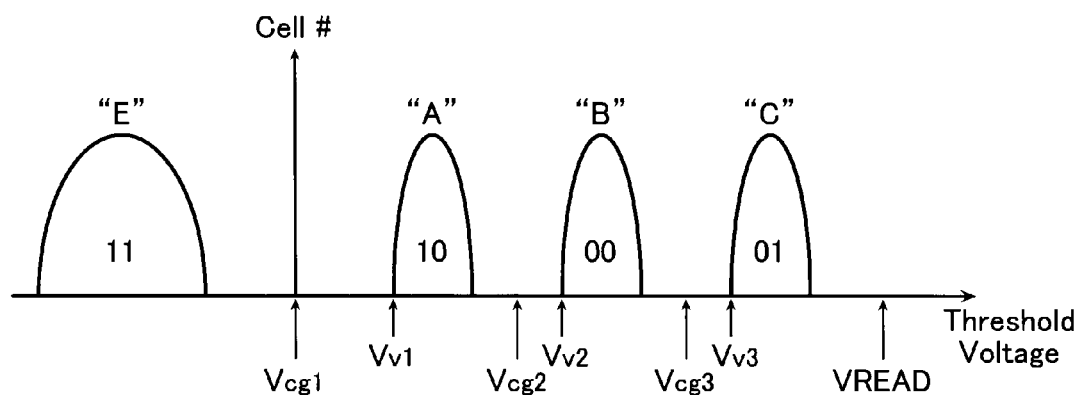
FIG. 4 shows another data threshold distribution.

To perform data storage with a large capacity, it will be used a multi-level data storage scheme, in which one cell stores two or more bits. For example, FIG. 4 shows a data threshold distribution in a four-level data storage scheme. Data state "E" is an erase state with a negative threshold voltage. From this erase state, three positive threshold states are set as data states "A", "B" and "C". Verify-reading with verify voltages Vv1, Vv2 and Vv3 (Vv1<Vv2<Vv3) applied to the selected word line at a write-verifying time, the lower limit values of data threshold distributions "A", "B" and "C" may be set.

The four-level data is expressed by (LB, UB) (where "UB" is upper page bit; and "LB" lower page bit). According to a data bit assignment, the four-level data will be expressed as follows: E=(1,1); A=(1,0); B=(0,0) and C=(0,1).

Data read is performed with an upper page read operation and a lower page read operation. In case of the above-described bit assignment, the upper page read is performed under the condition that read voltage Vcg2 set between data states "A" and "B" is applied to a selected word line. The lower page read is performed with a read operation with read voltage Vcg1 set between data states "E" and "A" and another read operation with read voltage Vcg3 set between data states "B" and "C".

So far, the brief of the NAND-type flash memory has been explained. In this embodiment, it is taken into consideration that even if the erase-verify is degraded under the influence of coupling noise, the degraded erase-verify precision does not influence on the read operation. The desirable read condition will be set in accordance with what erase-verify conditions are used.

It will be explained below some desirable read operation conditions defined in association with erase-verify conditions.

Embodying Mode 1

It will be explained an embodying mode 1 with such an erase-verify scheme for verifying the negative threshold erase state that cell current is carried from the cell source line CELSRC to the bit line BL.

Figure 5:
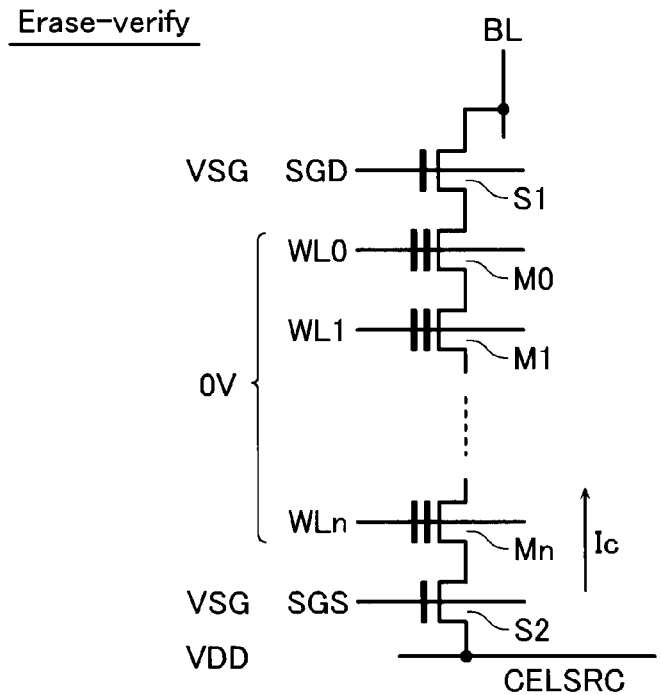
FIG. 5 shows a bias condition in an erase-verify mode in accordance with an embodying mode 1.

FIG. 5 shows a bias condition at an erase-verity time giving attention to a NAND string. All word lines in an erase block are applied with a certain voltage equal to or high than the ground potential (for example, 0V); and select gate lines SGD and SGS are applied with select voltage VSG set to turn on the select gate transistors; and cell source line CELSRC is applied with, for example, the power supply voltage VDD. In this case, if all cells are erased to have about a negative threshold voltage, −Vth, or lower than it, cell current Ic flows from the cell source line CELSRC to the bit line BL, so that the bit line BL will be charged up to Vth. Detect this bit line charged up level with the sense amplifier, and it may be detected that all cells in the NAND string have been erased.

Figure 6:
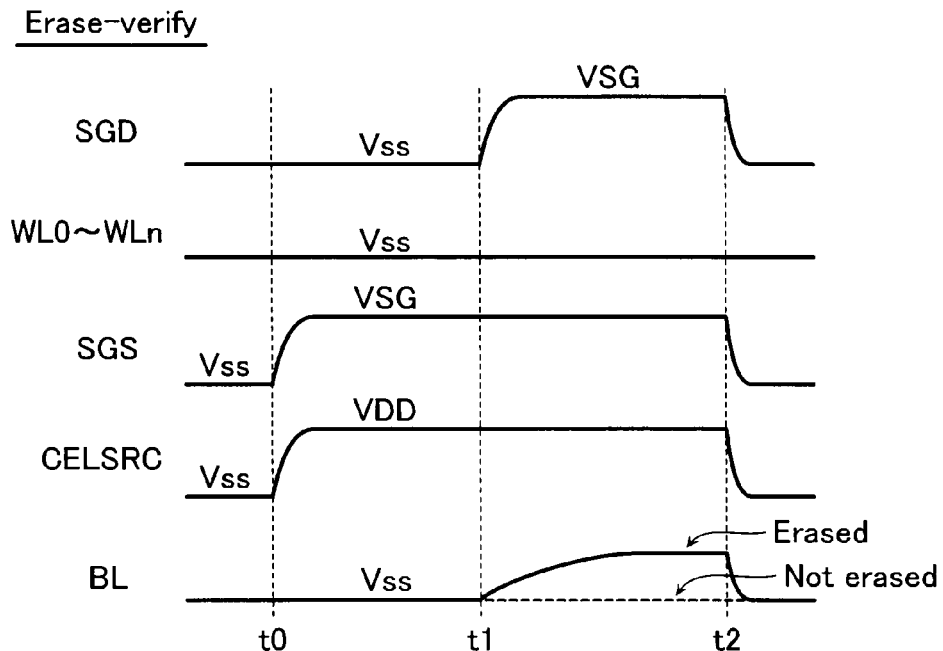
FIG. 6 shows the waveforms of the erase-verify operation in the embodying mode 3.

FIG. 6 shows the waveforms in the erase-verify mode. Source line side select gate line SGS and source line CELSRC are raised to be VSG and VDD, respectively, at timing t0, and then select gate line SGD on the bit line side is set at VSG at timing t1. As a result, both of the select gate transistors are turned on, and the bit line will be charged-up to about the absolute value of the cell threshold voltage in case all cells have been erased to a negative threshold voltage. If there is an unerased cell, the bit line is not charged up.

When the bit line side select gate line SGD is raised at timing t1 in this erase-verify scheme, the adjacent word line WL0 is boosted by coupling noise, so that the memory cell M0 underlying the word line WL0 may be turned on even if it has not been sufficiently erased, and this leads to erroneous judgment that the erase-verify is passed.

Figure 7:
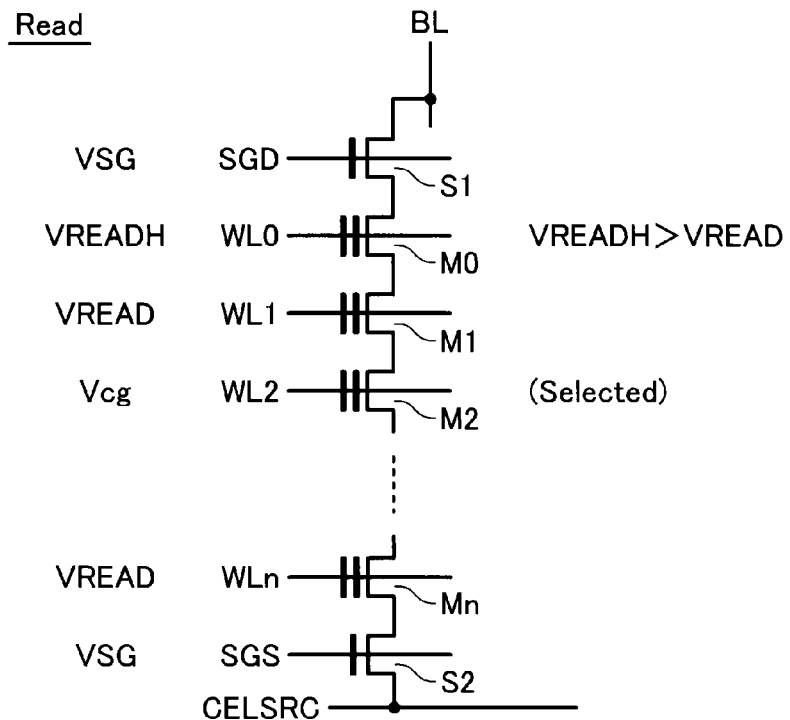
FIG. 7 shows the read bias condition in the embodying mode 1.

FIG. 7 shows one read operation condition, in which the above-described erase-verify condition is taken into consideration, giving attention to a NAND string. That is, a selected block to be subjected to data read has been previously erased under the above-described erase-verify condition, and then data has been written therein.

Word line WL2 is a selected one, to which read voltage Vcg is applied. Unselected word lines WL1 and WL3-WL31 are applied with read pass voltage VREAD that turns on cells without regard to cell data, and another unselected word line WL0 disposed adjacent to the select gate line SGD is applied with another read pass voltage VREADH set to be higher than VREAD. Select gate lines SGD and SGS are applied with select voltage VSG that turns on the select gate transistors.

Note here the read voltage Vcg is the same as shown in FIG. 3 in case of the binary data storage scheme while it is one selected from Vcg1 to Vcg3 in case of the four-level data storage scheme shown in FIG. 4.

Figure 8:
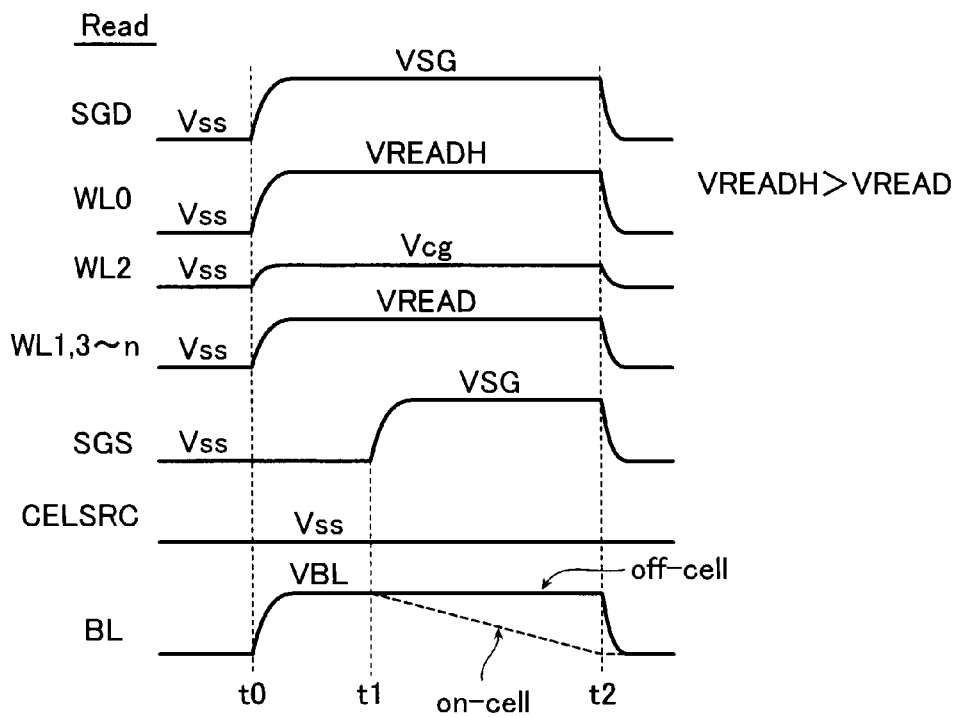
FIG. 8 shows the waveforms of the read operation.

FIG. 8 shows the waveforms in the read mode. In this case shown here, there is used a bit line precharge type of sense amplifier and it is detected whether the precharged bit line is discharged or not. Note here that a different type of, i.e., a current detecting type of sense amplifier may be used.

At timing t0, select gate line SGD is applied with select voltage VSG; word lines are applied with read voltage Vcg, read pass voltages VREAD and VREADH, respectively; and bit line BL is precharged at VBL. Then, at timing t1, source line side select gate line SGS is applied with select voltage VSG, so that the bit line discharge operation through the NAND string starts. In accordance with cell data, the bit line will be discharged (on-cell) or not discharged (off-cell). Detecting this bit line discharge state, data may be read.

In this embodiment, with respect to word line WL0 influenced with capacitive coupling from the select gate line SGD, which is selected later in the erase-verify mode, there is a possibility that the corresponding cell M0 has been judged as erased in spite of the insufficiently erased negative threshold state. In consideration of this situation, read pass voltage applied to the word line WL0 is set at VREADH higher than another read pass voltage VREAD applied to the remaining unselected word lines. With this bias condition, data read may be performed under the condition that unselected cells are set surely in an on-state with a low resistance.

In other words, even if the erase state is not assured precisely, it becomes possible to normally read data without influence of the erase state.

Embodying Mode 2

Figure 9:
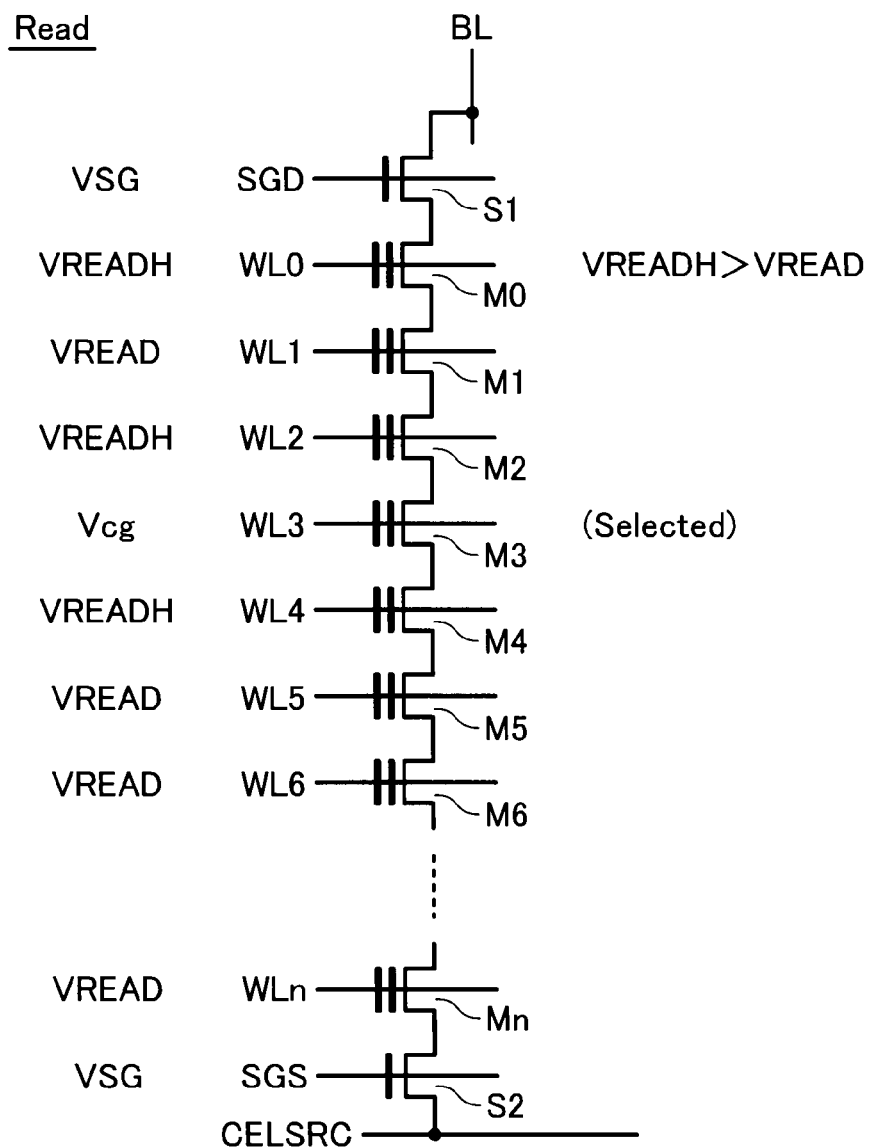
FIG. 9 shows the read bias condition in embodying mode 2 in comparison with the embodying mode 1.

FIG. 9 shows another example of the read operation condition, in which the same erase-verify condition is adapted as that explained in FIGS. 5 and 6, in correspondence with that shown in FIG. 7 giving attention to one NAND string. The difference from that shown in FIG. 7 will be explained as follows.

FIG. 9 shows a case where word line WL3 is selected, and read voltage Vcg is applied to it. With respect to unselected word lines, (1) WL1 and WL5-WLn are applied with read pass voltage VREAD; (2) WL2 and WL4 disposed adjacent to the selected word line WL3 are applied with read pass voltage VREADH higher than VREAD; and (3) WL0 disposed adjacent to the select gate line SGD is applied with VREADH.

The situation that the unselected word line WL0 disposed adjacent to the select gate line SGD is applied with the higher read pass voltage VREADH is based on the same reason as that in the above-described embodying mode 1. The reason why the unselected word lines WL2 and WL4 are applied with the higher read pass voltage VREADH is as follows: when the selected word line WL3 is applied with a low read voltage Vcg, the adjacent unselected word lines WL2 and WL4 are reduced in potential by capacitive coupling from the selected word line WL3, so that cells M2 and M4 underlying these word lines WL2 and WL4 may be insufficiently turned on with the normal read pass voltage.

In consideration of the above-described situation, as similar to the embodying mode 1, even if the erase state is not assured precisely, it becomes possible to normally read data without influence of the erase state. In addition, it becomes possible to prevent the unselected cells adjacent to the selected word line from being reduced in channel conductance due to capacitive coupling in a read mode. For controlling the unselected cells' conductivity to be higher, there is no need of preparing many kinds of read pass voltages in addition to the higher read pass voltage VREADH.

Embodying Mode 3

Another embodying mode 3 will be explained below, in which cell current is carried from the bit line to the cell source line in a NAND string for verifying erased cell's negative threshold voltage.

Figure 10:
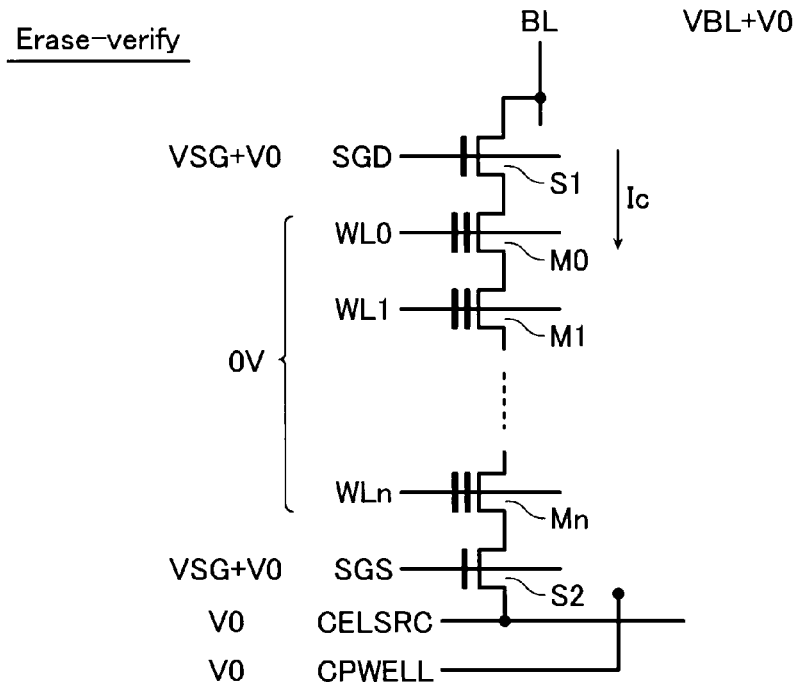
FIG. 10 show the bias condition of erase-verify operation in accordance with embodying mode 3.

FIG. 10 shows a bias condition in the erase-verify mode giving attention to a NAND string. All word lines in a block to be erased are applied with 0V; source line CELSRC and cell P-well node CPWELL are applied with positive voltage V0; select gate lines SGD and SGS are applied with select voltage VSG+V0; and bit line BL is applied with VBL+V0.

Here, assuming that the erase cell's negative threshold voltage to be verified is equal to about −Vth or lower, the positive voltage V0 is set at about V0=Vth. Under the above-described bias condition, if all cells in the NAND string are erased to −Vth, cell current Ic flows from bit line BL to source line CELSRC. Detect whether the bit line current flows or not (i.e., whether the precharged bit line is lowered in level or not), and it becomes possible to judge whether all cells in the NAND string have been erased or not.

Figure 11:
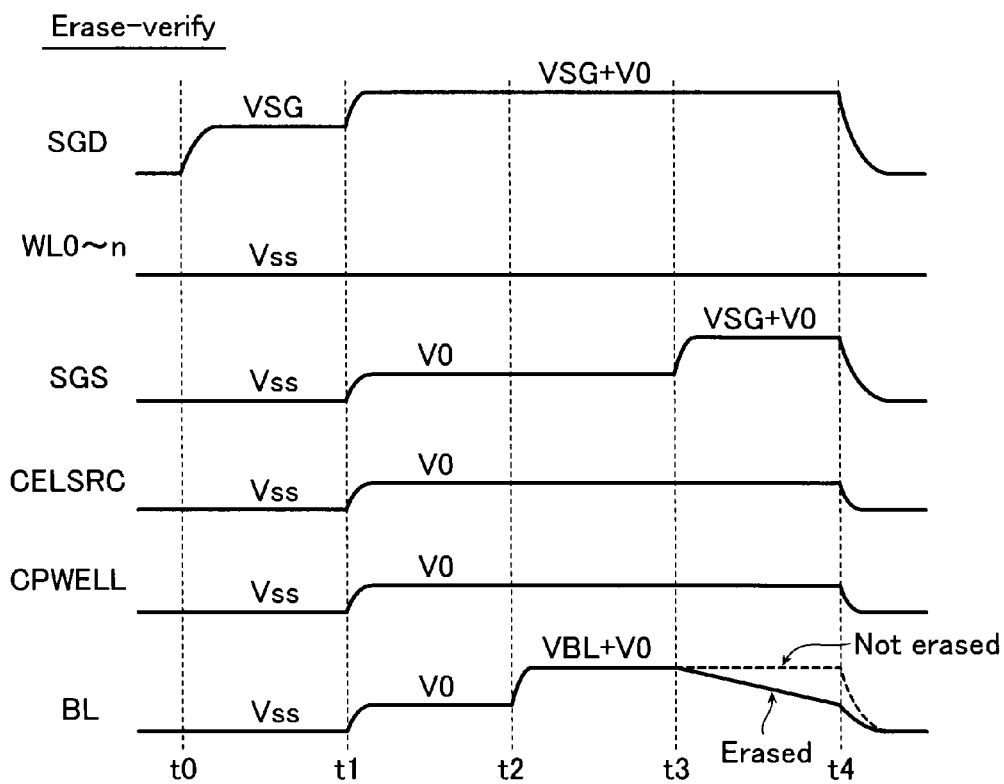
FIG. 11 shows the waveforms of the erase-verify operation in the embodying mode 3.

FIG. 11 shows the waveforms in the erase-verify mode. At timing t0, bit line side select gate line SGD is applied with select voltage VSG; and all word lines are applied with 0V. At timing t1, cell source line CELSRC and cell well node CPWELL are applied with V0. At the same timing, +V0 is applied to select gate lines SGD, SGS and bit line BL.

Precharge the bit line to VBL+V0 at timing t2, and then boost the source line side select gate line SGS to VSG+V0 at timing t3. As a result, if all cells in the NAND string have been sufficiently erased, bit line BL will be discharged. By contrast, if there is an insufficiently erased cell, bit line will not be discharged. Detect this bit line discharged state, and erase-verify may be performed.

In this embodying mode 3, as reversed to embodying modes 1 and 2, unselected word line WLn disposed adjacent to source line side select gate line SGS is influenced by capacitive coupling when the select gate line SGS is driven in the erase-verify mode. Therefore, it is word line WLn to be taken into consideration for setting the read pass voltage in the read mode.

Figure 12:
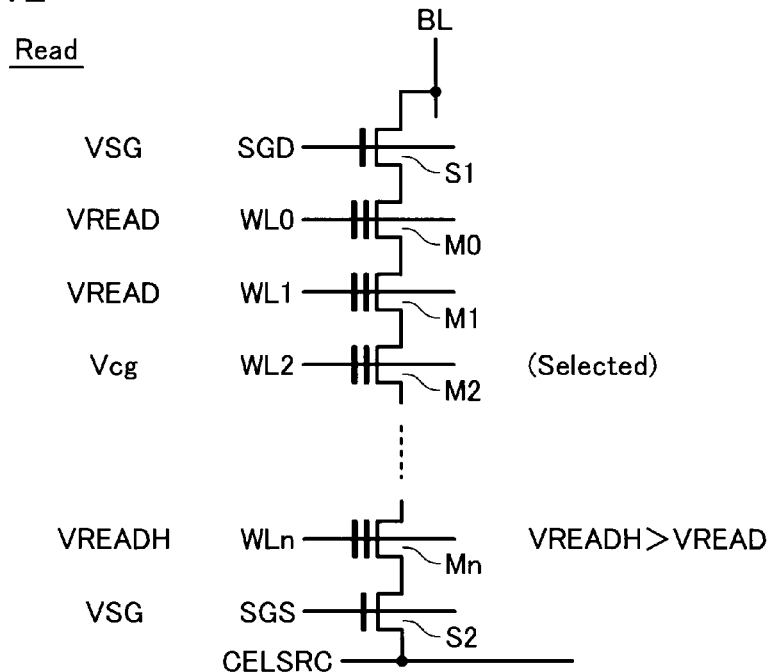
FIG. 12 shows the read bias condition in the embodying mode 3.

FIG. 12 shows one read operation condition, in which the above-described erase-verify condition is taken into consideration, giving attention to a NAND string. That is, a selected block to be subjected to data read has been previously erased under the above-described erase-verify condition, and then data has been written therein.

Word line WL2 is a selected one, to which read voltage Vcg is applied. With respect to unselected word lines, those excepting word line WLn disposed adjacent to the select gate line SGS are applied with read pass voltage VREAD that turns on cells without regard to cell data, and the unselected word line WLn disposed adjacent to the select gate line SGS is applied with another read pass voltage VREADH higher than VREAD. Select gate lines SGD and SGS are applied with select voltage VSG that turns on the select gate transistors.

As similar to the above-described embodying modes, the read voltage Vcg is selected in accordance with cell data to be read out in case of the binary data storage scheme shown in FIG. 3 or in case of the four-level data storage scheme shown in FIG. 4.

Figure 13:
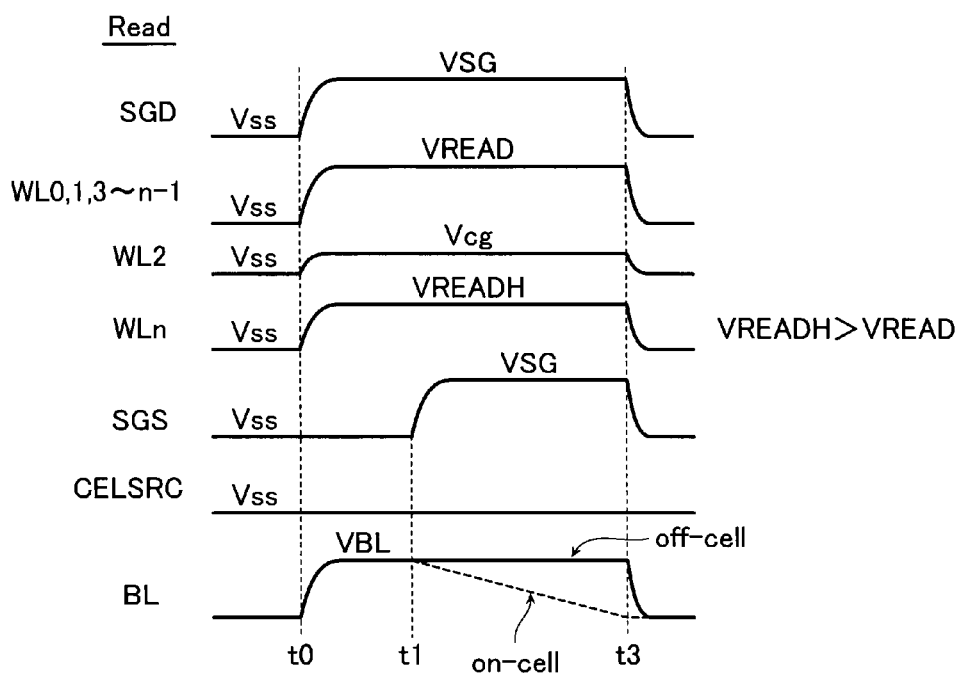
FIG. 13 shows the waveforms of the read operation.

FIG. 13 shows the waveforms in the read mode. In this case shown here, there is used a bit line precharge type of sense amplifier and it is detected whether the precharged bit line is discharged or not.

At timing t0, select gate line SGD is applied with select voltage VSG; word lines are applied with read voltage Vcg, read pass voltages VREAD and VREADH, respectively; and bit line BL is precharged at VBL. Then, at timing t1, source line side select gate line SGS is applied with select voltage VSG, so that the bit line discharge operation through the NAND string starts. In accordance with cell data, the bit line will be discharged (on-cell) or not be discharged (off-cell). Detecting this bit line discharge state, data may be read.

In this embodiment, with respect to word line WLn, which is influenced with capacitive coupling from the later selected select gate line SGS in the erase-verify mode, there is a possibility that the corresponding cell Mn has been judged as erased in spite of the insufficiently erased negative threshold state. In consideration of this situation, read pass voltage applied to the word line WLn is set at VREADH higher than another read pass voltage VREAD applied to the remaining unselected word lines. With bias this condition, data read may be performed under the condition that unselected cells are set surely in an on-state with a low resistance.

In other words, even if the erase state is not assured precisely, it becomes possible to normally read data without influence of the erase state.

Embodying Mode 4

Figure 14:
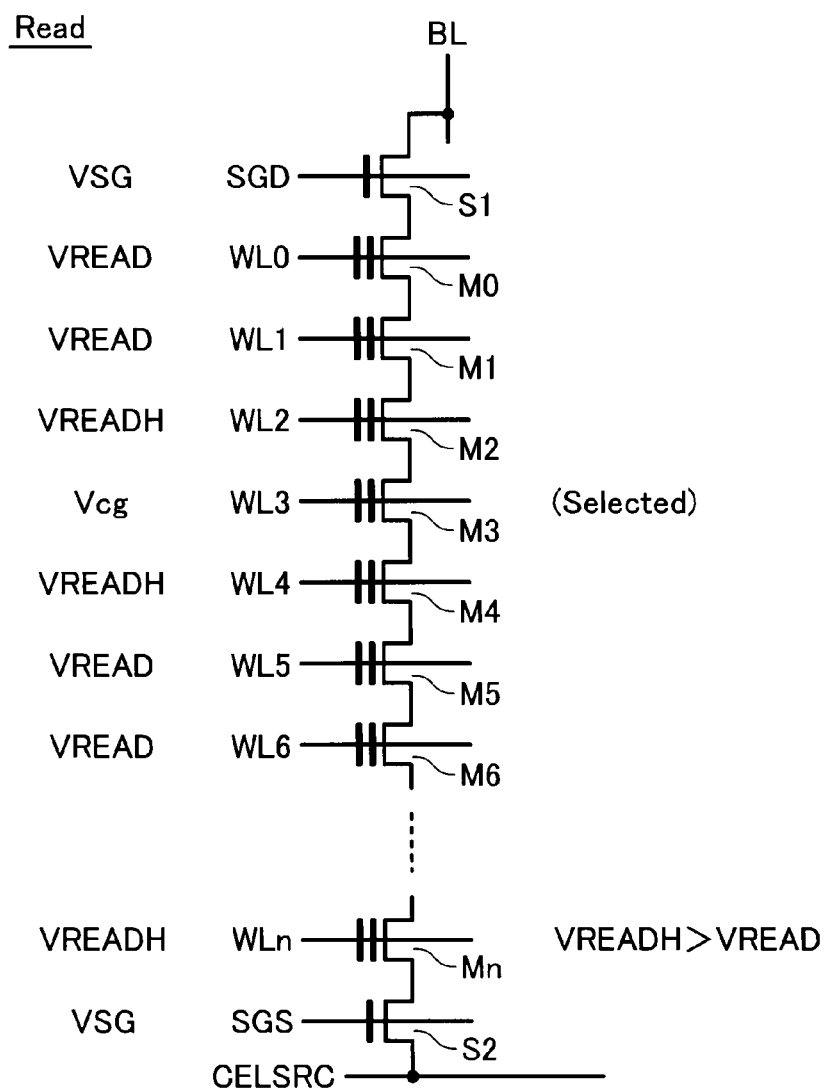
FIG. 14 shows the read bias condition in embodying mode 4 in comparison with that of FIG. 12.

FIG. 14 shows another read operation condition, in which the same erase-verify condition as explained in FIGS. 10 and 11, giving attention to a NAND string. It is the same as embodying mode 2 explained in FIG. 12 that the read pass voltage applied to unselected word lines disposed adjacent to the selected word line is taken into consideration.

In FIG. 14, WL3 is a selected word line, to which read voltage is applied. With respect to unselected word lines, WL1 and WL5-WLn-1 are applied with read pass voltage VREAD; WL2 and WL4 are applied with read pass voltage VREADH higher than VREAD; and WLn disposed adjacent to the select gate line SGS is also applied with VREADH.

The reason why the unselected word line WLn adjacent to the select gate line SGD is applied with the higher read pass voltage VREADH is the same as embodying mode 3. The reason why the unselected word lines WL2 and WL4 adjacent to the select word line WL3 is applied with the higher read pass voltage VREADH is the same as embodying mode 2.

As a result, even if the erase state is not assured precisely, it becomes possible to normally read data without influence of the erase state. In addition, it becomes possible to prevent the unselected cells adjacent to the selected word line from being reduced in channel conductance due to capacitive coupling in a read mode.

Embodying Mode 5

Recently, as the integration and the capacity of the NAND-type flash memory progress, various write disturbances become problematic. As one of them, there is such a problem that a cell disposed adjacent to a select gate transistor is degraded in write property. That is, the write property of the adjacent cell is disturbed due to capacitive coupling from the select gate transistor, or due to that the adjacent cell is set in a different write condition from others based on that the select gate transistor is disposed near it.

Against this problem, it is effective to insert a dummy cell, which is disposed adjacent to a select gate transistor in the NAND string and not used for storing data. The dummy cell is coupled to a dummy word line, and dealt with the normal cells, i.e., it is subjected to erase and erase-verify.

If it is performed in the NAND-type flash memory with the above-described dummy cell scheme the same erase-verify operation as explained in embodying mode 1, the dummy word line disposed adjacent to the bit line side select gate line SGD is influenced with the capacitive coupling noise from the select gate line SGD, and there is a possibility that the dummy cell is judged as erased in spite of that it is not sufficiently erased.

Figure 15:
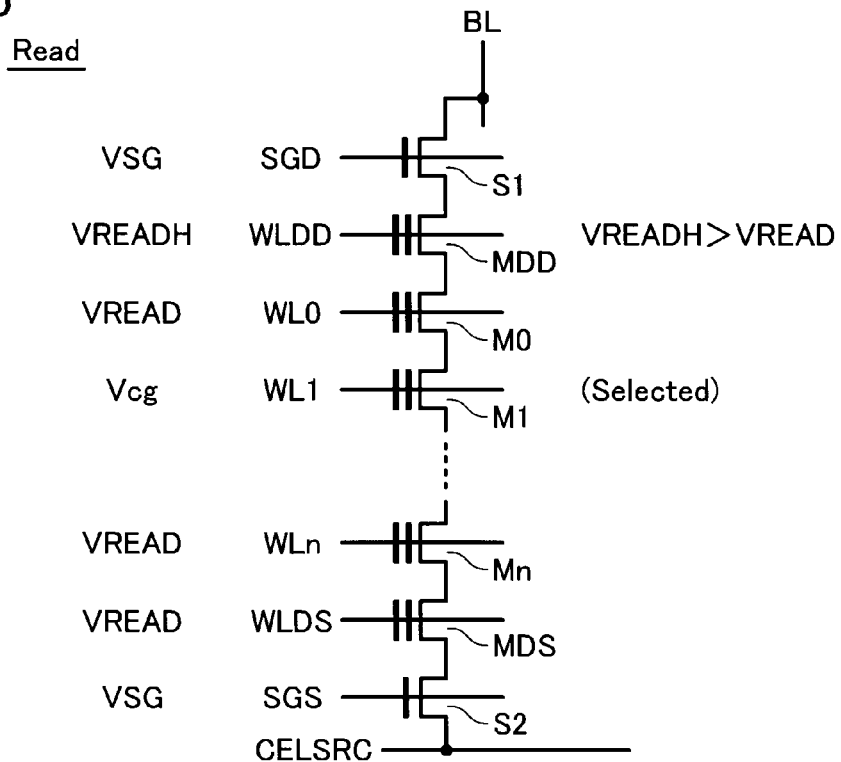
FIG. 15 shows the read bias condition in embodying mode 5.

FIG. 15 shows a read operation condition in correspondence to that shown in FIG. 7, in which the above-described situation is taken into consideration. As shown in FIG. 15, dummy cells MDD and MDS are inserted to be adjacent to the select gate transistors S1 and S2, control gates of which are coupled to dummy word lines WLDD and WLDS, respectively.

A selected word line WL1 is applied with read voltage Vcg; other word lines WL0 and WL2-WLn and dummy word line WLDS on the select gate line SGS side are applied with read pass voltage VREAD; and dummy word line WLDD on the select gate line SGD side is applied with read pass voltage VREADH higher than VREAD.

As a result, even if the erase state of the dummy cell MDD on the bit line side is not assured precisely, it becomes possible to normally read data without influence of the erase state. Although there is not shown here, it is effective in this dummy cell scheme that two adjacent unselected word lines sandwiching the selected word line are applied with the higher read pass voltage VREADH like embodying mode 2.

Further, although dummy cells are disposed on the both ends of the NAND string in FIG. 15, this embodying mode is effective in such a case that there is disposed only one dummy cell MDD on the bit line side.

Embodying Mode 6

Figure 16:
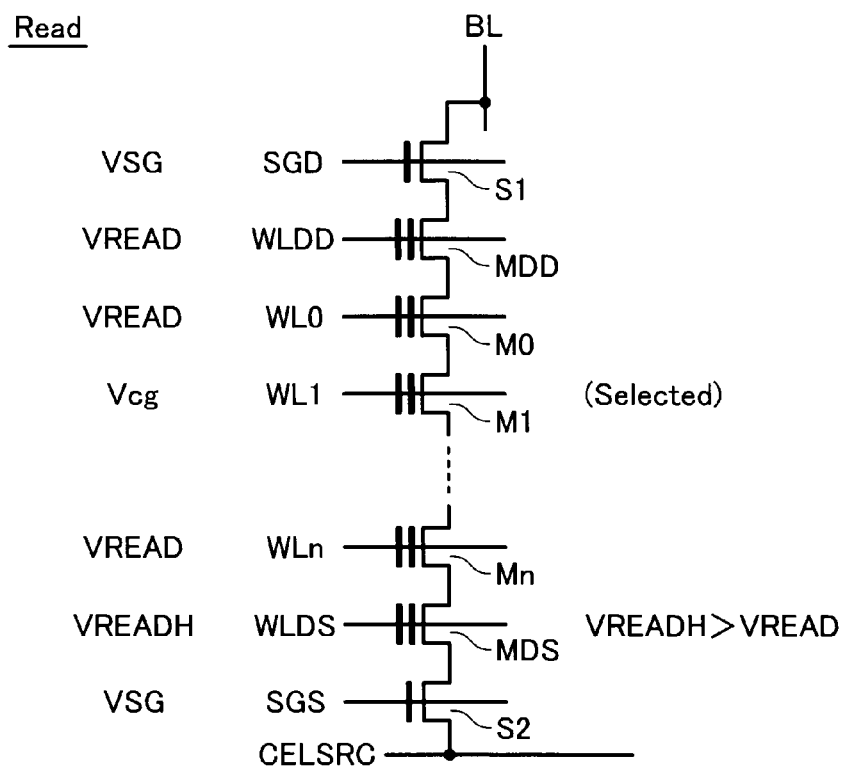
FIG. 16 shows the read bias condition in embodying mode 6.

FIG. 16 shows another read condition in the same dummy cell scheme as shown in FIG. 15, which is set in corresponding to that shown in FIG. 12.

A selected word line WL1 is applied with read voltage Vcg; other word lines WL0 and WL2-WLn and dummy word line WLDD on the select gate line SGD side are applied with read pass voltage VREAD; and dummy word line WLDS on the select gate line SGS side is applied with read pass voltage VREADH higher than VREAD.

As a result, even if the erase state of the dummy cell MDS on the source line side is not assured precisely, it becomes possible to normally read data without influence of the erase state. Although there is not shown here, it is effective in this dummy cell scheme that two adjacent unselected word lines sandwiching the selected word line are applied with the higher read pass voltage VREADH like embodying mode 4.

Further, although dummy cells are disposed on the both ends of the NAND string in FIG. 16, this embodying mode is effective in such a case that there is disposed only one dummy cell MDS on the source line side.

Application Devices

As another embodiment, an electric card using the non-volatile semiconductor memory devices according to the above-described embodiment of the present invention and an electric device using the card will be described bellow.

Figure 17:
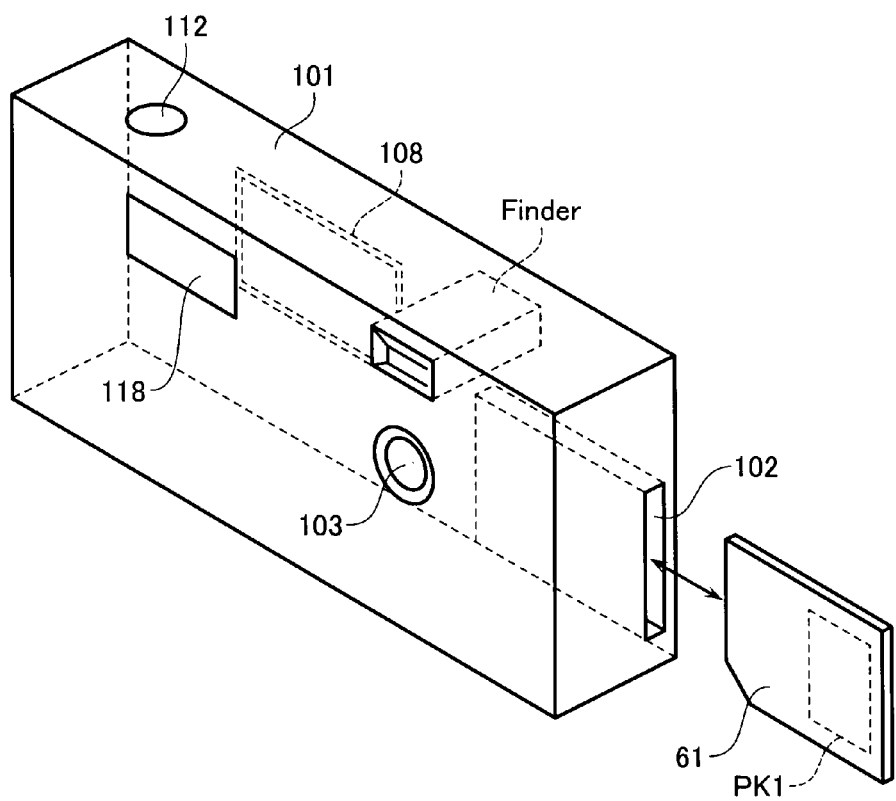
FIG. 17 shows another embodiment applied to a digital still camera.

FIG. 17 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 18:
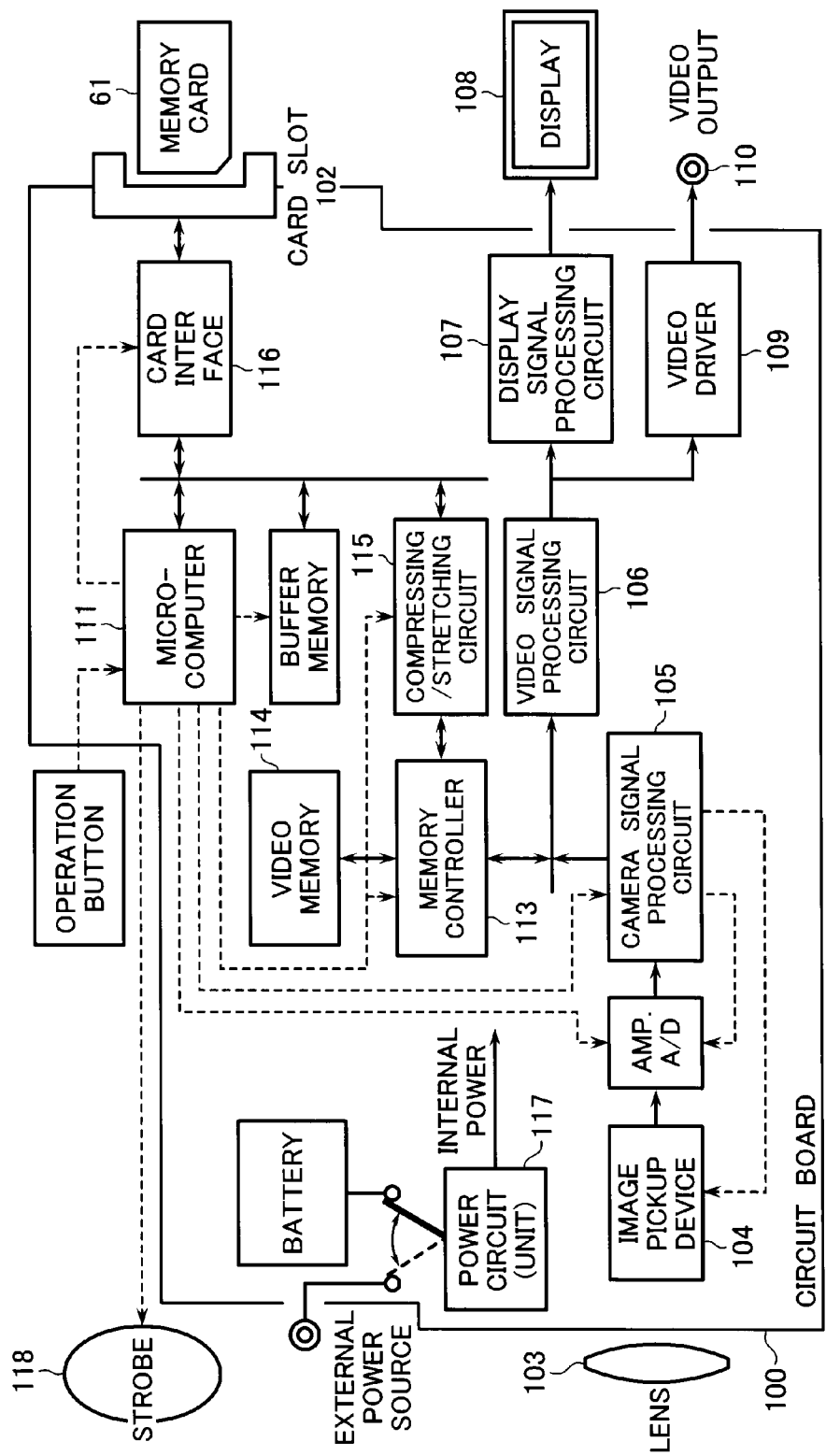
FIG. 18 shows the internal configuration of the digital still camera.
Figure 19A:
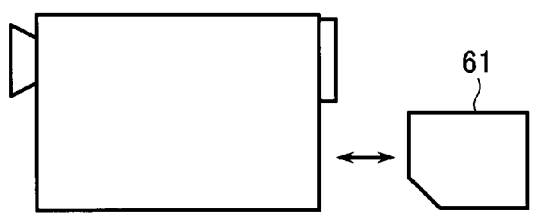
FIGS. 19A to 19J show other electric devices to which the embodiment is applied.
Figure 19F:
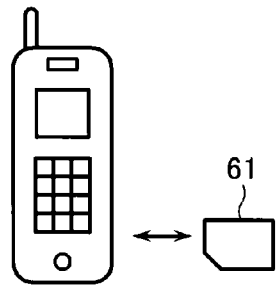
Figure 19B:
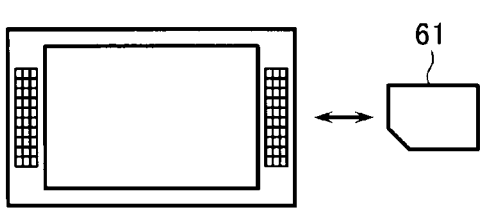
Figure 19G:
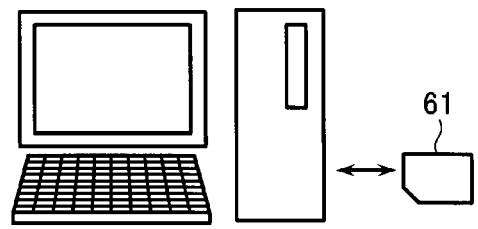
Figure 19C:
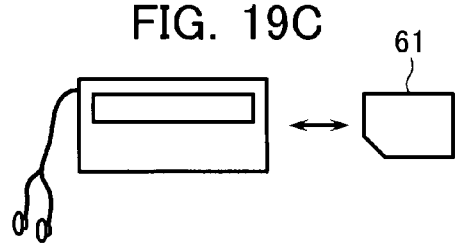
Figure 19H:
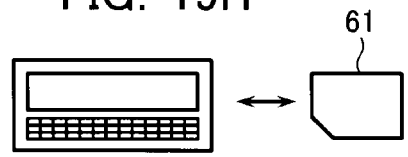
Figure 19D:
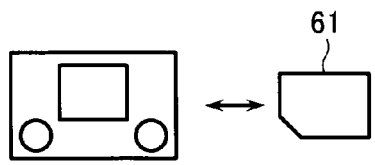
Figure 19I:
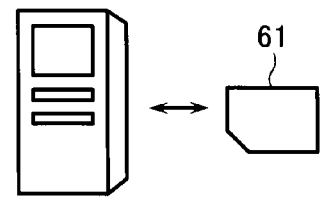
Figure 19E:
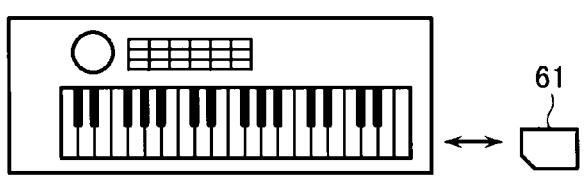
Figure 19J:
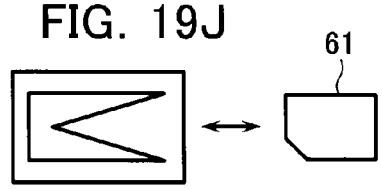

FIG. 18 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 19A to 19J, as well as in portable electric devices. That is, the electric card can also be used in a video camera shown in FIG. 19A, a television set shown in FIG. 19B, an audio apparatus shown in FIG. 19C, a game apparatus shown in FIG. 19D, an electric musical instrument shown in FIG. 19E, a cell phone shown in FIG. 19F, a personal computer shown in FIG. 19G, a personal digital assistant (PDA) shown in FIG. 19H, a voice recorder shown in FIG. 19I, and a PC card shown in FIG. 19J.

This invention is not limited to the above-described embodiments. It will be understood by those skilled in the art that various changes in form and detail may be made without departing from the spirit, scope, and teaching of the invention.

What is claimed is:

1. A non-volatile semiconductor memory device comprising a NAND string, in which multiple memory cells are connected in series, one end of the NAND string being coupled to a bit line via a first select gate transistor while the other end is coupled to a source line via a second select gate transistor, wherein
the memory device has a data read mode performed under the bias condition of: a selected cell in the NAND string is applied with a read voltage; and unselected cells in the NAND string are applied with read pass voltages set to turn on cells without regard to cell data, and wherein
in the data read mode, one of the unselected cells adjacent to one of the first and second select gate transistor is applied with a first read pass voltage, two unselected cells adjacent to the selected cell are applied with the first read pass voltage, and the other unselected cells are applied with a second read pass voltage lower than the first read pass voltage.

2. The non-volatile semiconductor memory device according to claim 1, wherein
the memory device has an erase-verify mode for erase-judging by detecting whether the bit line is charged-up to a certain level or not with cell current carried from the source line to the bit line under the condition that all cells in the NAND string are applied with a voltage equal to or higher than the ground potential; the second select gate transistor is turned on; and the first select gate transistor is turned on later than the second select gate transistor, and wherein
in the data read mode, the one of the unselected cells disposed adjacent to the first select gate transistor is applied with the first read pass voltage higher than the second read pass voltage applied to the other unselected cells.

3. The non-volatile semiconductor memory device according to claim 1, wherein
the memory device has an erase-verify mode for erase-judging by detecting whether the bit line is lowered to a certain level or not with cell current carried from the bit line to the source line under the condition that all cells in the NAND string are applied with a voltage equal to or higher than the ground potential; the source line and a well on which the NAND string is formed are applied with a positive voltage; the bit line is applied with a bit line voltage higher than the positive voltage; the first select gate transistor is turned on; and the second select gate transistor is turned on later than the first select gate transistor, and wherein
in the data read mode, the one of the unselected cells disposed adjacent to the second select gate transistor is applied with the first read pass voltage higher than the second read pass voltage applied to the other unselected cells.

4. The non-volatile semiconductor memory device according to claim 1, wherein
the one of the unselected cells adjacent to one of the first and second select gate transistor, which is applied with the first read pass voltage, is a dummy cell.

5. A non-volatile semiconductor memory device comprising a NAND string, in which multiple memory cells are connected in series, one end of the NAND string being coupled to a bit line via a first select gate transistor while the other end is coupled to a source line via a second select gate transistor, control gates of the memory cells being coupled to word lines respectively while gates of the first and second select gate transistors are coupled to first and second select gate lines, respectively, wherein
the memory device has a data read mode performed under the bias condition of: a selected word line in the NAND string is applied with a read voltage; an unselected word line adjacent to one of the first and second select gate lines is applied with a first read pass voltage; two unselected word lines adjacent to the selected word line are applied with the first read pass voltage; and the other unselected word lines are applied with a second read pass voltage lower than the first read pass voltage.

6. The non-volatile semiconductor memory device according to claim 5, wherein
the memory device has an erase-verify mode for erase-judging by detecting whether the bit line is charged-up to a certain level or not with cell current carried from the source line to the bit line under the condition that all word lines in the NAND string are set at a voltage equal to or higher than the ground potential; the second select gate transistor is turned on; and the first select gate transistor is turned on later than the second select gate transistor, and wherein
in the data read mode, the unselected word line adjacent to the first select gate line is applied with the first read pass voltage higher than the second read pass voltage applied to the other unselected word lines.

7. The non-volatile semiconductor memory device according to claim 5, wherein
the memory device has an erase-verify mode for erase-judging by detecting whether the bit line is lowered to a certain level or not with cell current carried from the bit line to the source line under the condition that all word lines in the NAND string are set at a voltage equal to or higher than the ground potential; the source line and a well on which the NAND string is formed are applied with a positive voltage; the bit line is applied with a bit line voltage higher than the positive voltage; the first select gate transistor is turned on; and the second select gate transistor is turned on later than the first select gate transistor, and wherein
in the data read mode, the unselected word line adjacent to the second select gate line is applied with the first read pass voltage higher than the second read pass voltage applied to the other unselected word lines.

8. The non-volatile semiconductor memory device according to claim 5, wherein
the unselected word line adjacent to one of the first and second select gate lines applied with the first read pass voltage is a dummy word line.

9. A non-volatile semiconductor memory device comprising a NAND string, in which multiple memory cells are connected in series, one end of the NAND string being coupled to a bit line via a first select gate transistor while the other end is coupled to a source line via a second select gate transistor, first and second dummy cells being inserted in the NAND string to be disposed adjacent to the first and second select gate transistors, respectively, control gates of the memory cells and the first and second dummy cells being coupled to word lines and first and second dummy word lines, respectively, while gates of the first and second select gate transistors are coupled to first and second select gate lines, respectively, wherein the memory device has a data read mode performed under the bias condition of: a selected word line in the NAND string is applied with a read voltage; the first dummy word line is applied with a first read pass voltage; the second dummy word line and unselected word lines are applied with a second read pass voltage lower than the first read pass voltage; and an erase-verify mode for erase-judging by detecting whether the bit line is charged-up to a certain level or not with cell current carried from the source line to the bit line.

10. A non-volatile semiconductor memory device comprising a NAND string, in which multiple memory cells are connected in series, one end of the NAND string being coupled to a bit line via a first select gate transistor while the other end is coupled to a source line via a second select gate transistor, first and second dummy cells being inserted in the NAND string to be disposed adjacent to the first and second select gate transistors, respectively, control gates of the memory cells and the first and second dummy cells being coupled to word lines and first and second dummy word lines, respectively, while gates of the first and second select gate transistors are coupled to first and second select gate lines, respectively, wherein the memory device has a data read mode performed under the bias condition of: a selected word line in the NAND string is applied with a read voltage; the second dummy word line is applied with a first read pass voltage; the first dummy word line and unselected word lines are applied with a second read pass voltage lower than the first read pass voltage; and an erase-verify mode for erase-judging by detecting whether the bit line is lowered to a certain level or not with cell current carried from the bit line to the source line.

11. A non-volatile semiconductor memory device comprising a NAND string, in which multiple memory cells are connected in series, one end of the NAND string being coupled to a bit line via a first select gate transistor while the other end is coupled to a source line via a second select gate transistor, wherein the memory device has a data read mode performed under the bias condition of: a selected cell in the NAND string is applied with a read voltage; and unselected cells in the NAND string are applied with read pass voltages set to turn on cells without regard to cell data; an erase-verify mode for erase-judging by detecting whether the bit line is lowered to a certain level or not with cell current carried from the bit line to the source line under the condition that all cells in the NAND string are applied with a voltage equal to or higher than the ground potential; the source line and a well on which the NAND string is formed are applied with a positive voltage; the bit line is applied with a bit line voltage higher than the positive voltage; the first select gate transistor is turned on; and the second select gate transistor is turned on later than the first select gate transistor, and wherein in the data read mode, the unselected cell adjacent to the second select gate transistor is applied with a first read pass voltage while the other unselected cells except unselected cells adjacent to the selected cell are applied with a second read pass voltage lower than the first read pass voltage.

12. The non-volatile semiconductor memory device according to claim 11, wherein the unselected cell applied with the first read pass voltage is a dummy cell.

13. A non-volatile semiconductor memory device comprising a NAND string, in which multiple memory cells are connected in series, one end of the NAND string being coupled to a bit line via a first select gate transistor while the other end is coupled to a source line via a second select gate transistor, control gates of the memory cells being coupled to word lines, respectively, while gates of the first and second select gate transistors are coupled to first and second select gate lines, respectively, wherein the memory device has a data read mode performed under the bias condition of: a selected word line in the NAND string is applied with a read voltage; an unselected word line adjacent to the second select gate line is applied with a first read pass voltage; the other unselected word lines except unselected word lines adjacent to the selected word line are applied with a second read pass voltage lower than the first read pass voltage; an erase-verify mode for erase-judging by detecting whether the bit line is lowered to a certain level or not with cell current carried from the bit line to the source line under the condition that all word lines in the NAND string are set at a voltage equal to or higher than the ground potential; the source line and a well on which the NAND string is formed are applied with a positive voltage; the bit line is applied with a bit line voltage higher than the positive voltage; the first select gate transistor is turned on; and the second select gate transistor is turned on later than the first select gate transistor.

14. The non-volatile semiconductor memory device according to claim 13, wherein the unselected word line applied with the first read pass voltage is a dummy word line.

* * * * *